United States Patent
Leigh et al.

(10) Patent No.: US 8,009,438 B2
(45) Date of Patent: Aug. 30, 2011

(54) SERVER INFRASTRUCTURE HAVING INDEPENDENT BACKPLANES TO DISTRIBUTE POWER AND TO ROUTE SIGNALS

(75) Inventors: Kevin B. Leigh, Houston, TX (US); Jonathan E. James Ou, Houston, TX (US); David W. Sherrod, Tomball, TX (US); Kurt A. Manweiler, Tomball, TX (US); Miles B. Reyes, Houston, TX (US); Gregory L. Gibson, The Woodlands, TX (US); Stephen A. Kay, Tomball, TX (US); Vincent W. Michna, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 373 days.

(21) Appl. No.: 11/729,470

(22) Filed: Mar. 29, 2007

(65) Prior Publication Data

US 2008/0239687 A1 Oct. 2, 2008

(51) Int. Cl.
*H05K 1/11* (2006.01)

(52) U.S. Cl. .................. 361/788; 361/794

(58) Field of Classification Search .............. 361/780, 361/784, 785, 788, 792, 794, 777; 174/50, 174/261, 262; 439/61, 62, 65, 188, 668, 439/669, 676

See application file for complete search history.

(56) References Cited

U.S. PATENT DOCUMENTS

| | | | | |
|---|---|---|---|---|
| 4,153,127 A | * | 5/1979 | Klink et al. | 180/65.1 |
| 4,511,950 A | * | 4/1985 | Bunner et al. | 361/788 |
| 5,748,451 A | * | 5/1998 | Thompson et al. | 361/788 |
| 6,157,534 A | * | 12/2000 | Gallagher et al. | 361/724 |
| 6,528,737 B1 | * | 3/2003 | Kwong et al. | 174/262 |
| 6,757,177 B2 | * | 6/2004 | Harris et al. | 361/788 |
| 7,321,312 B1 | * | 1/2008 | Garnett | 340/653 |
| 7,336,502 B1 | * | 2/2008 | Goergen | 361/788 |
| 2002/0181215 A1 | * | 12/2002 | Guenthner | 361/784 |
| 2004/0253842 A1 | * | 12/2004 | Barsun et al. | 439/59 |
| 2007/0083690 A1 | * | 4/2007 | Koga et al. | 710/301 |

OTHER PUBLICATIONS

U.S. Appl. No. 11/669,860, filed Jan. 31, 2007, Leigh et al.

* cited by examiner

*Primary Examiner* — Yuriy Semenenko (57) ABSTRACT

Embodiments of the present technique are directed to a backplane infrastructure. The backplane infrastructure may include a passive power backplane configured to distribute power and comprising a first set of alignment holes, a signal backplane configured to route interface signals and comprising a second set of alignment holes and a set of common alignment pins, each alignment pin having an axis, wherein the set of common alignment pins are inserted into the first set of alignment holes and the second set of alignment holes to align the passive power backplane and the signal backplane about the axis.

26 Claims, 8 Drawing Sheets

SERVER INFRASTRUCTURE HAVING INDEPENDENT BACKPLANES TO DISTRIBUTE POWER AND TO ROUTE SIGNALS

BACKGROUND

This section is intended to introduce the reader to various aspects of art, which may be related to various aspects of the present invention that are described and/or claimed below. The discussion is believed to be helpful in providing the reader with background information to facilitate a better understanding of the various aspects of the present subject matter. Accordingly, it should be understood that these statements are to be read in this light, and not as admissions of prior art.

Computer servers are used by a wide array of users in various configurations. Server systems often comprise multiple server blades housed in a chassis and/or in a standard rack mount. As processing needs and computing performance have increased, server blades have become more powerful while being reduced in size. Thus, chassis and rack mount systems are capable of enclosing an increasing number of these small form factor server blades that provide an increasing amount of performance. As more server blades and other components are added to a server system, cabling between the server blades and other components may become difficult. For example, a server system may still require the same number of cabled connections to each server blade though the small form factor physically limits the space available to connect each of the server blades and other components to interface signals and power sources.

Further, as servers have become more capable, power requirements have increased significantly. To meet this demand a server system may include multiple power supply modules to generate power and distribute the power to server blades, switches and fans contained in the system. Modern server blades may require hundreds of watts of power to support high-performance processors and memory components. As a result, the server system may need to deliver significant power at high currents to meet power requirements of the server blades and other components. Thus, a robust system is desired to route the high current power to the server blades and other components.

DETAILED DESCRIPTION OF SPECIFIC EMBODIMENTS

One or more exemplary embodiments of the will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in greater detail below, one or more embodiments of the present techniques provide a novel backplane system for routing power and interface signals to server blades contained within a chassis. In one embodiment, a passive power backplane and a signal backplane are aligned and coupled via a base bracket including alignment pins. However, upon reading the following description, it will be apparent that the disclosed techniques may be generally used to expand other signal routing systems, including blade servers and other servers. The server infrastructure having an independent backplane system may increase the scalability of such devices by offering modularity in design and operation. Further, the independent nature of the signal backplanes and the power backplanes may provide enhanced reliability and performance as the design complexity may be reduced and electromagnetic interference between the interface signals and the power may be reduced.

Figure 1:
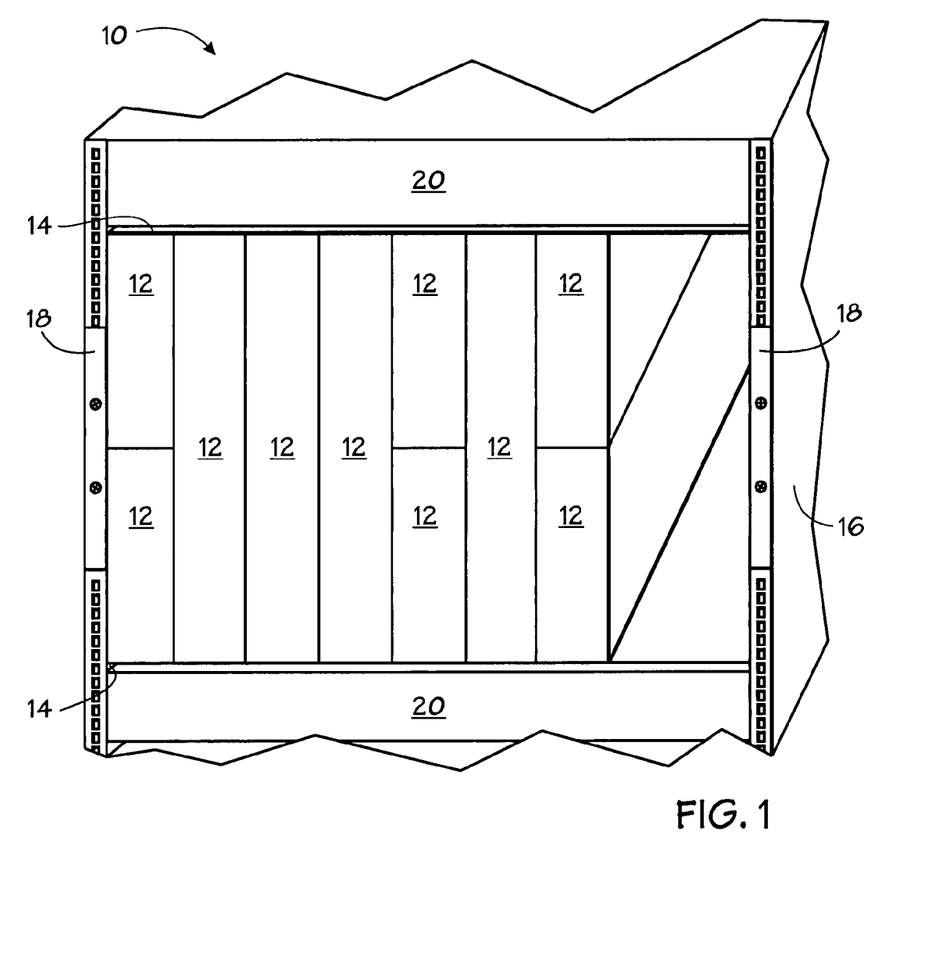
FIG. 1 is a block diagram illustrating a rack mount system having a plurality of modular computer servers in accordance with one embodiment of the present technique.

Turing now to the figures, an exemplary rack mount system 10 is illustrated in FIG. 1 in accordance with one embodiment of the present technique. In the illustrated embodiment, the rack mount system 10 includes a number of computer servers 12 disposed within a chassis or enclosure 14. The chassis 14 is disposed in a rack structure or housing 16 and mounted thereto via mounting brackets 18. As discussed in greater detail below, the servers 12 are modular, in that additional components may be externally mounted to the servers 12 to convert or upgrade the servers 12. Additionally, other components 20 may also be disposed in the rack structure 16 in accordance with the present technique. As will be appreciated, other components 20 may include additional computer servers, power supplies, operator interfaces, and the like. It should also be noted that the rack structure 16 may have any number and configuration of rack mount receptacles having supports, such as manual or automatic rail mechanisms that support the servers 12, the chassis 14, or various other components 20. It should be noted that, although the exemplary servers 12 are illustrated as blade servers, the disclosed signal and power routing techniques are generally applicable to electronic devices including non-blade computer servers.

Each server 12 may include a number of configurations to provide various functions in the system 10. Internally, each server 12 may include one or more structures, including a printed circuit assembly (PCA) including a printed circuit board (PCB), hard disk drives, volatile or non-volatile memory devices, processors and controllers, for instance. Thus, each server 12 may provide the system 10 with one or more functions, such as power, cooling, networking, various interconnects and data management, for example. For a server 12 to perform these services within a rack mount system 10, interface signals and power may be delivered to the server 12. Power may include a 12V or −48V power provided to the server 12 from a power supply located in the chassis 14 or rack structure 16, for example. Interface signals may include data transmitted from a user on a system network, or data transmitted between servers 12, for example.

As the complexity of rack mount systems 10 increases, various issues may arise. For example, as more servers 12 are added to a system 10, a multitude of signals may be routed between the servers 12 and other components 20. Further, each of the servers 12 may require a substantial amount of power to operate. Thus, rack mount systems 10 may require an increasingly complex arrangement of cabling to ensure interface signals and power are routed to each server 12. An example of a complex system 10 may include multiple servers 12 connected to a switch module configured to route interface signals. As an illustration, if four connections may be required to interconnect a server 12 to a switch, and there are sixteen servers 12, then sixty-four connections are required. If the same configuration has eight switches, then 512 connections may be required. Thus, the complexity of connections may increase exponentially with the size of a system 10. In addition to the complexity of routing interface signals, the amount of power routed to the servers 12 may be substantial. For example, a 500 W direct current (DC) server 12 using −48V or 12V power may require a current of 10 amps or 40 amps, respectively. Therefore, routing power to each of the servers 12 may also prove challenging.

To address these concerns, backplanes may be used to interconnect servers 12 to switches and other basic infrastructure modules such as power supplies, fans, and enclosure managers. In accordance with the requirements of modern servers 12, the backplane may need to support routing interface signals at multiple gigabits per second (Gbps) and be capable of delivering hundreds of watts of power. To provide this functionality, a backplane may include a PCB used to route the interface signals and distribute power. However, as servers 12 continue to become more capable and decrease in size, an increasing number of high-speed interface signals and large amounts of power may need to be routed over a decreasing amount of space available per server 12. Thus, two concerns remain: the complexity of designing a compact backplane that routes high-speed interface signals and large amounts of power, and reducing interference, such as power supply switching noise coupling to high-speed interface signals and interference due to routed power.

Figure 2:
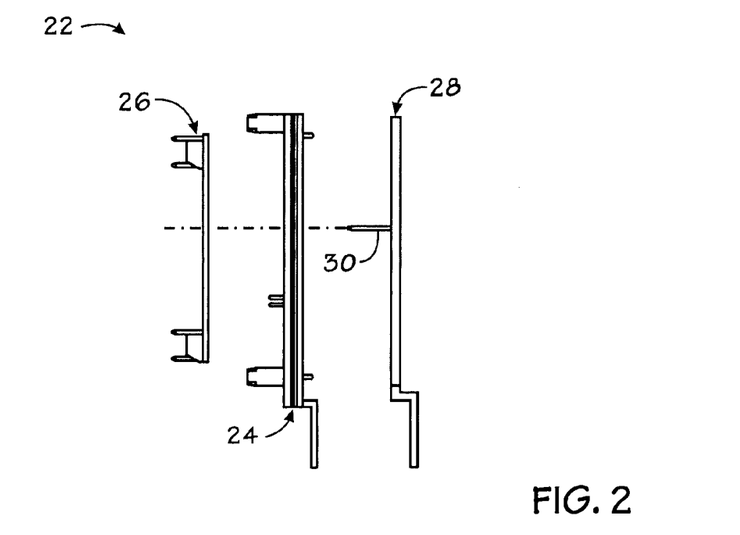
FIG. 2 is an exploded side view of a server backplane infrastructure in accordance with one embodiment of the present technique.
Figure 3:
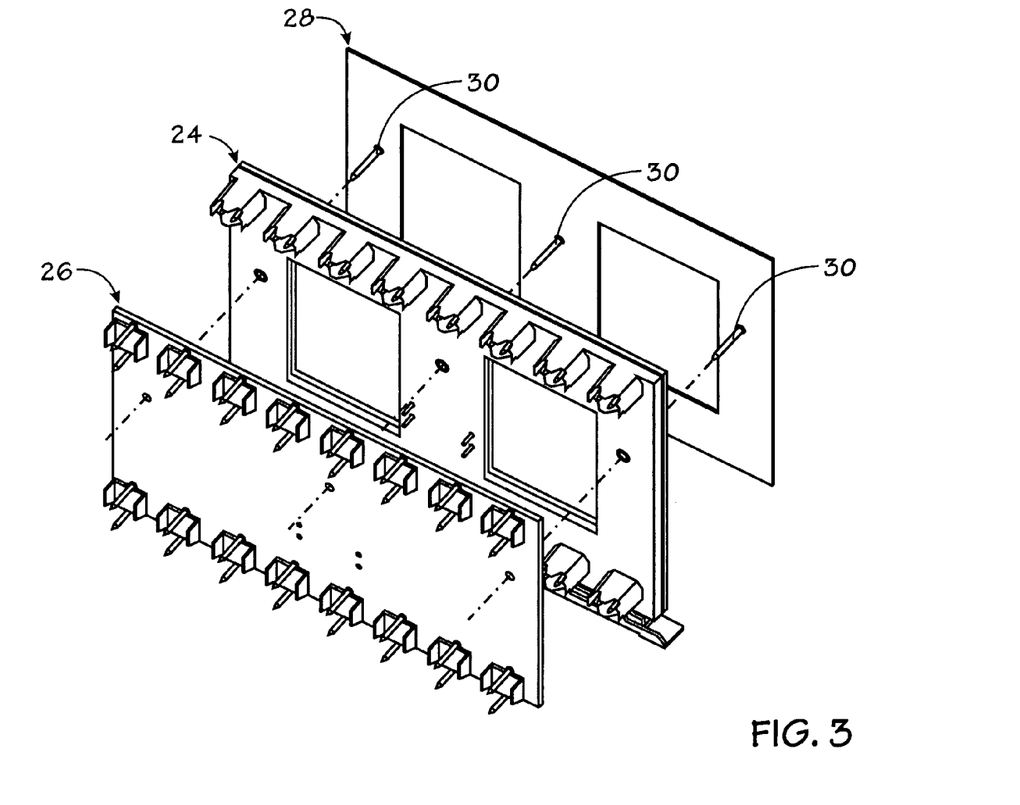
FIG. 3 is an exploded perspective view of the server backplane infrastructure of FIG. 2 in accordance with one embodiment of the present technique.

Turning now to FIGS. 2 and 3, an exemplary embodiment of a server infrastructure backplane assembly 22 is illustrated. The backplane assembly comprises an independent passive power backplane 24, an independent signal backplane 26 and a base bracket 28. As will be discussed in greater detail below, the merger and alignment of the power backplane 24 and the signal backplane 26 is aided by alignment pins 30 located on the base bracket 28. The merger allows the backplane assembly 22 to act as a single unit to route interface signals and distribute power to the servers 12 and other components 20 of the system 10.

Figure 4:
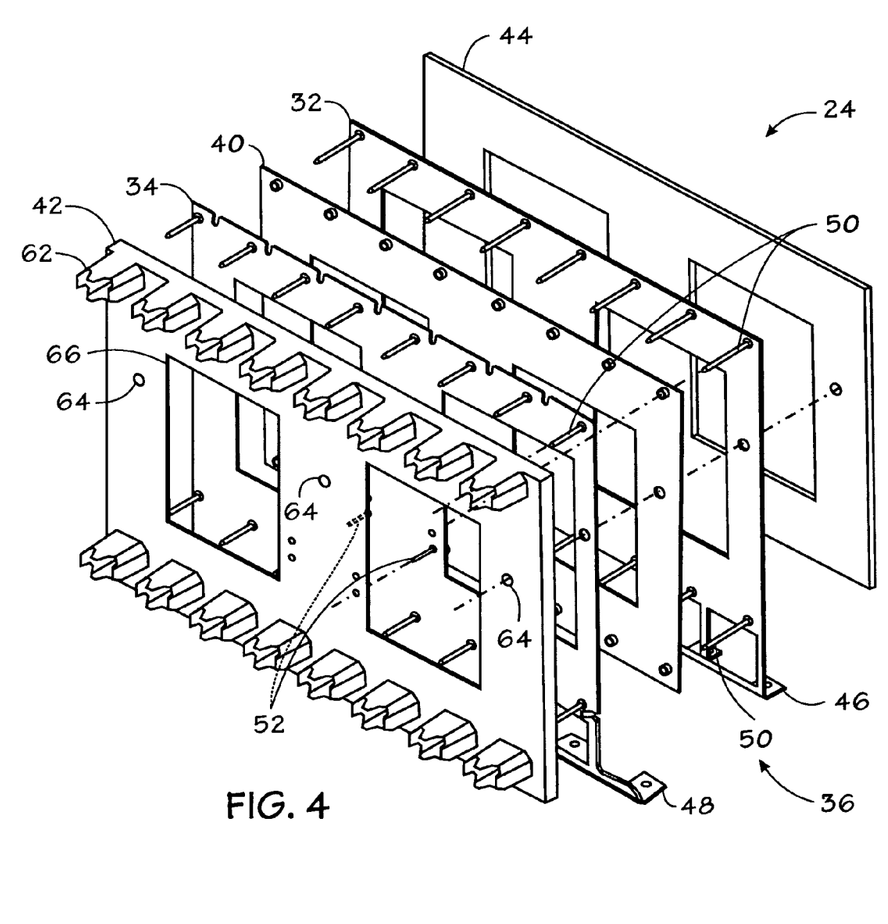
FIG. 4 is an exploded perspective view of the front of the power backplane of FIGS. 2 and 3 in accordance with one embodiment of the present technique.
Figure 5:
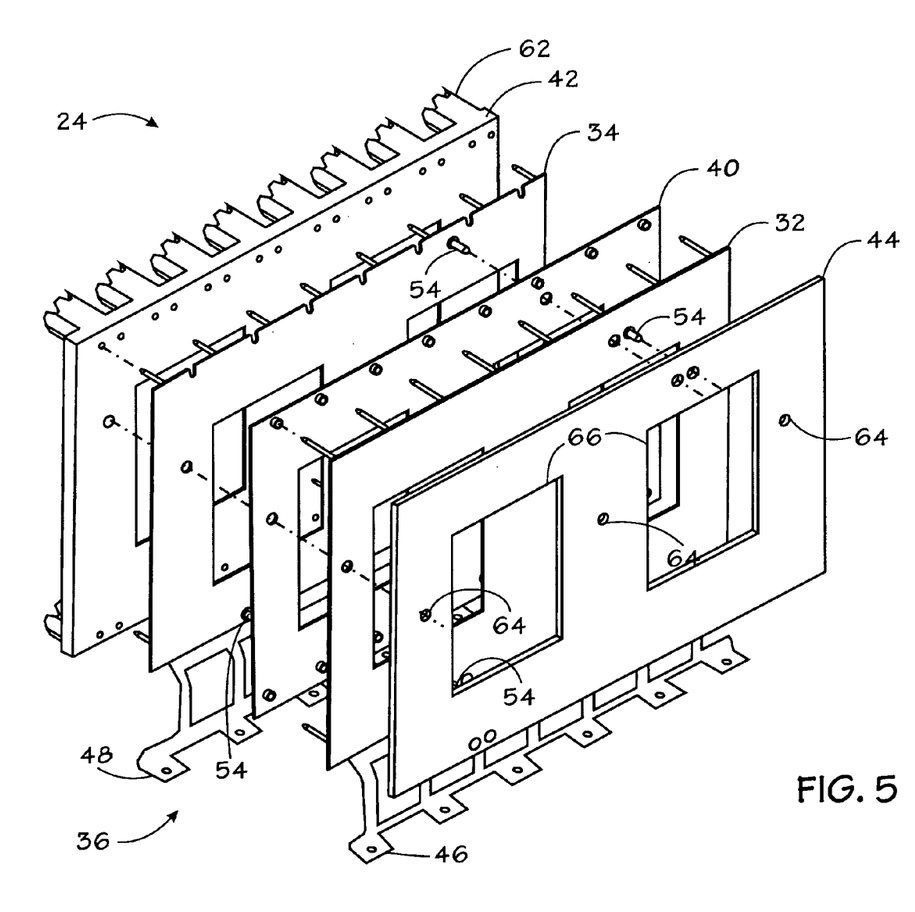
FIG. 5 is an exploded perspective view of the back of the power backplane of FIG. 4 in accordance with one embodiment of the present technique.

To ensure that the power distributed to the servers 12 and other components 20 does not interfere (e.g., create cross-talk and power supply switching noise) with the interface signals transmitted to the servers 12 and other components 20, the power backplane 24 may be advantageously independent of the signal backplane 26. Turning now to FIGS. 4 and 5 an embodiment of the power backplane 24 is depicted in accordance with embodiments of the present technique. As illustrated, the power backplane 24 may include multiple components, such as a positive power plane 32, a negative power plane 34, power input pins 36, power delivery pins 50, 52, 54, a mid separator plate 40, a front insulator/separator 42 and a rear insulator/separator 44.

As will be appreciated, to deliver power to the servers 12, the power backplane 24 includes a route for positive DC distribution and a route for negative DC distribution. Thus, as depicted in FIGS. 4 and 5, the power backplane 24 may include a positive power plane 32 and a negative power plane 34. As discussed previously, the power backplane 24 may be required to distribute high current power to the servers 12 and other components of the system 10. Accordingly, the positive power plane 32 and the negative power plane 34 should be capable of reliably supplying the power required. As depicted in FIGS. 4 and 5, one embodiment may include forming each of the positive power plane 32 and the negative power plane 34 from a solid sheet/plate of conductive material, such as copper. The simplicity and size of the sheet provides a reliable and substantial path for the distribution of power. Further, the lack of active components (such as power regulators, FETs, I2C controllers) reduces failure mechanisms, and the material area and thickness of the plates 32 and 34 reduces resistance and provides a path to distribute large quantities of power.

Power may be routed to the power planes 32 and 34 via power inputs pins 36. For example, as depicted in FIGS. 4 and 5, the power input pins 36 may include a set of positive power input pins 46 and a set negative power input pins 48. The positive power input pins 46 may include "feet-like" extensions extending from the positive power plane 32. Similarly, the negative power input pins 48 may include "feet-like" extensions extending from the negative power plane 34. The power input pins 36 may be configured to electrically couple the positive power plane 32 to positive terminals of a power source and electrically couple the negative power plane 34 to negative terminals of a power source. For example, a power source may be located in the chassis or enclosure 14 and include terminals that align with the power input pins 36 of the power backplane 24. As will be appreciated by those of ordinary skill in the art, a power source may be located remotely and be electrically coupled to the power input pins 36 via other mechanisms. For example, the power input pins 36 may electrically coupled to a cabled connection or power bus that delivers power from a remote power source.

The power backplane 24 may distribute power to the servers 12 and other components 20 via various power delivery pins 50, 52, 54. As depicted in the FIGS. 4 and 5, the power delivery pins may include a set of server power delivery pins 50, signal backplane power delivery pins 52 and component power delivery pins 54. In one embodiment, each set of server power delivery pins 50 may include a pin extending from the positive power plane 32 and a pin extending from the negative power plane 34. The power delivery pins 50 may be electrically coupled to the respective power planes 32 and 34, and arranged for mating with a power connector 56 of a server 12 as described and illustrated with respect to FIGS. 10 and 11. As depicted, and discussed in greater detail below, two rows of server power delivery pins 50 may be provided to accommodate various server configurations.

The signal backplane power delivery pins 52 may be provided to route power from the power backplane 24 to components electrically coupled to the signal backplane 26 as illustrated and further described below with respect to FIGS. 6 and 7. For example, the signal backplane 26 may require low power consumption, and, therefore, the signal backplane power delivery pins 52 may be electrically coupled to the signal backplane 26 and allow the signal backplane 26 to distribute power to switches and other modules (e.g., an enclosure manager). In such an embodiment, the reduced amount of power routed across the signal backplane 26 may not increase the complexity of design because the low power may not interfere with the interface signals routed on the signal backplane 26.

Similarly, other components 20 of the system 10 may also require power. In an embodiment, as depicted in FIG. 5, the power backplane 24 may include component power delivery pins 54 to distribute power from the power backplane 24 to the other components 20 (see FIG. 1). For example, as depicted in FIG. 5, the power backplane 24 may include multiple sets of component power delivery pins 54 that are configured to distribute power to cooling fans. As will be appreciated, the power backplane 24 may include a variety of configurations to distribute power to a multitude of devices. For example, the power backplane 24 may include additional component power delivery pins 54 configured to supply power to additional power backplanes 24 (not shown) for distributing power in the system 10.

To insulate the positive and negative power planes 32 and 34 from one another, an insulating material may be provided between the positive power plane 32 and the negative power plane 24, as depicted in FIGS. 4 and 5. In one embodiment, a mid separator 40 may be located between the two power planes 32 and 34. For example, in one embodiment the power backplane 24 may include a multilayer PCB including a sheet of conductive material forming the positive power plane 32, a layer of substrate forming the mid separator 40 and an additional sheet of conductive material forming the negative power plane 34. As will be appreciated, the power planes 32 and 34 and the mid separator 40 may include other forms. For example, the mid separator 40 may comprise a separate insulating sheet inserted between the two power planes 32 and 34.

Further, insulators/separators may be located on both sides of the power backplane 24 to electrically isolate the power planes 32 and 34 from contacting conductive materials in the backplane assembly 22 and the surrounding environment, as further depicted in FIGS. 4 and 5. In one embodiment, the rear separator/insulator 44 may include an insulating plate coupled to the positive power plane 32. Similarly, the front insulator/separator 42 may include a plate coupled to the negative power plane 34.

The front insulator/separator 42 may also include additional features beneficial to the alignment of the power backplane 24, signal backplane 26 and complementary mating alignment features. For example, in one embodiment, the front insulator/separator 42 may include connector guides 62 that are configured to align and mate with the server power connectors 56 illustrated and described below with reference to FIGS. 10 and 11. Thus, as the servers 12 are inserted into the chassis or enclosure 14, the server power connector 56 may be aligned with the corresponding server power delivery pins 50.

As previously described, the power backplane 24 may also include a set of alignment holes 64 to aid in merging the power backplane 24, the signal backplane 26 and the base bracket 28 to form the backplane assembly 22. In one embodiment, these holes may be configured to receive alignment pins 30 protruding from the base bracket 28. For example, as depicted in FIGS. 4 and 5, three alignment holes 64 may extend through each component of the assembled power backplane 24 (such the positive power plane 32, the negative power plane 34, the mid separator 40, the front insulator/separator 42 and the rear insulator/separator 44). The alignment holes 64 may be positioned on the power backplane 24 such that they are configured to receive the three alignment pins 30 and, thus, align the power backplane 24 to the signal backplane 26 as illustrated and further described below with reference to FIG. 9. The alignment holes 64 and alignment pins 30 may be configured in any size shape or pattern that allows the alignment pins 30 to act as a datum for aligning the components of the backplane assembly 22.

Also noteworthy, the power backplane 24 may be shaped to conform to specific applications. For example, as depicted in FIGS. 3, 4 and 5, the power backplane 24 may include cutouts 66 configured to allow access to components of the signal backplane 26. In one embodiment, the cutouts 66 may include enough clearance to allow additional connections to switch module connectors 68 located on the rear of the signal backplane 26 as illustrated and further described below with reference to FIG. 7. As will be appreciated by those of ordinary skill in the arts, the power backplane 24 may take numerous shapes to accommodate various applications. For example, the power backplane 24 may include cutouts 66 that provide for sufficient airflow to cool the backplane assembly 22 and servers 12 of the system 10.

Further, an embodiment of the power planes 32 and 34 may not include any active components. In such a configuration, the power backplane 24 would be considered a "passive power backplane 24." As used herein, a "passive" backplane refers to a backplane that does not include any active components. In one embodiment, the power planes 32 and 34 each consist of a plate of conductive material, such as copper. The absence of active components provides for increased reliability of the power backplane 24. For example, a power backplane 24 including only passive components has less potential failure modes in comparison to a backplane that includes a variety of active components. As will be appreciated, passive components may include resistors, capacitors and the like. Therefore, an embodiment of the passive power backplane may include resistors, capacitors and similar components coupled to the power planes 32 and 34, and lacking active components.

Figure 6:
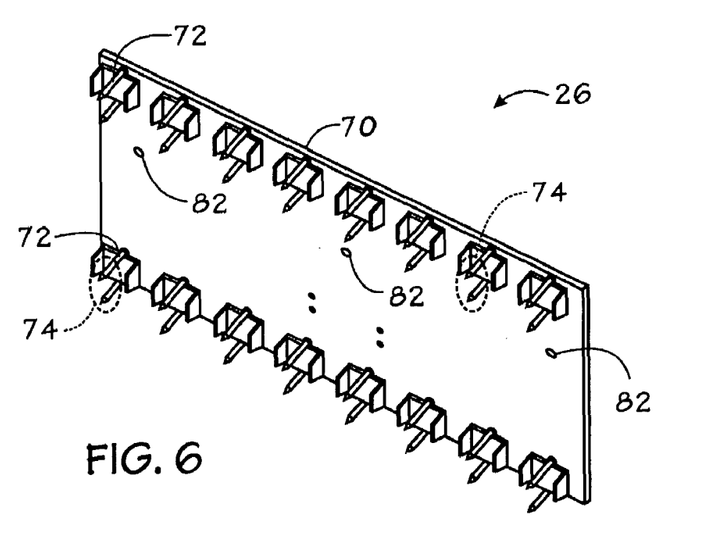
FIG. 6 is a perspective view of the front of the signal backplane of FIGS. 2 and 3 in accordance with one embodiment of the present technique.
Figure 7:
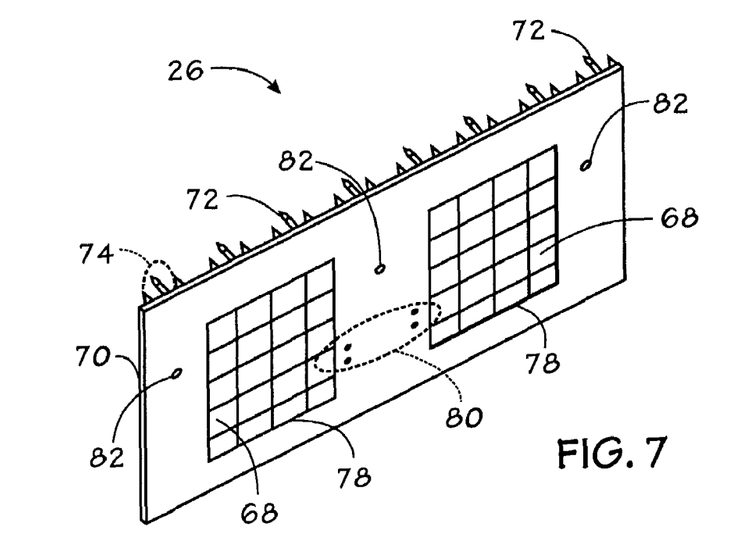
FIG. 7 is a perspective view of the back of the signal backplane of FIGS. 2, 3 and 6 in accordance with one embodiment of the present technique.

Turning now to FIGS. 6 and 7, an embodiment of the signal backplane 26, in accordance with aspects of the present technique, is illustrated. In one embodiment, the signal backplane 26 may be configured to route interface signals of the system 10 and to distribute reduced quantities of power. Generally, the power that is routed on a signal backplane 26 for use in I/O modules is on the order of one-tenth of the power delivered to severs via the backplane. For example, less than 1000 Watts may be distributed over the signal backplane for an IO module as compared to 8000 Watts that is typically provided to the servers via the power backplane 24. Due to the absence of high power distribution, concerns of interference between the power distributed and the interface signals may be minimized. For example, as depicted in FIGS. 6 and 7, the signal backplane 26 may comprise a PCB 70 designed to route interface signals between servers 12, switches and other components 20. Thus, the PCB 70 may include multiple layers of conductive traces to route interface signals. As will be appreciated, the absence of high power distribution via the signal backplane 26 also reduces the complexity of the PCB 70. For example, the reduction of additional power planes reduces the overall thickness of the PCB 70, thus, reducing the need to back-drill long via stubs that may otherwise increase design complexity and decrease signal integrity. Additionally, the lack of high power distribution on the signal backplane 26 also reduces the number of "keep-out" areas in the board layout, thereby, providing for routing of more interface signals in a smaller area.

To route the interface signals between servers 12 and other components 20, the signal backplane 26 may also include signal connectors 72 electrically coupled to the traces of the signal backplane 26. For example, as depicted in the embodiment of FIG. 6, the signal connectors 72 may include a set of signal pins 74. The signal pins 74 maybe configured to mate with a complementary server signal connector 76 of a server 12 illustrated and described further with reference to FIGS. 10 and 11. In another embodiment, secondary signal connectors 78 may be included on the signal backplane 26. For example, as depicted in FIG. 7, the signal backplane 26 may include secondary signal connectors 78 configured to connect to additional switch modules.

Power input pins 80 may be located on the signal backplane 26 to receive and distribute power to low power consumption devices, as depicted in FIG. 7. For example, as previously described, the power input pins 80 may be configured to receive power and distribute power to switch modules via the signal backplane 26. Due to the low power requirements of switches, this small power distribution may not significantly increase the complexity or reduce performance of the signal backplane 26. As will be appreciated, the signal backplane 26 may receive the power from a variety of sources, including the power backplane 24, and may distribute the power to active and passive components (such as processors), as necessary.

Similar to the discussion above regarding the alignment holes 64 of the power backplane 24, the signal backplane 26 may also include alignment holes 82 configured to accept alignment pins 30 (see FIGS. 2 and 3). For example, the PCB 70 of the signal backplane 26 may include three alignment holes 82 arranged in the same pattern as those located on the power backplane 24. Thus, the power backplane 24, signal backplane 26, and base bracket 28 may be aligned and mated via the insertion of the alignment pins 30 though the alignment holes 64 and 82 as illustrated and discussed in reference to FIG. 9. As will be appreciated, the alignment holes 64 and 82 and the alignment pins 30 may be configured in any size shape or pattern that provides for the alignment pins 30 to act as a datum for aligning the components of the backplane assembly 22.

Figure 8:
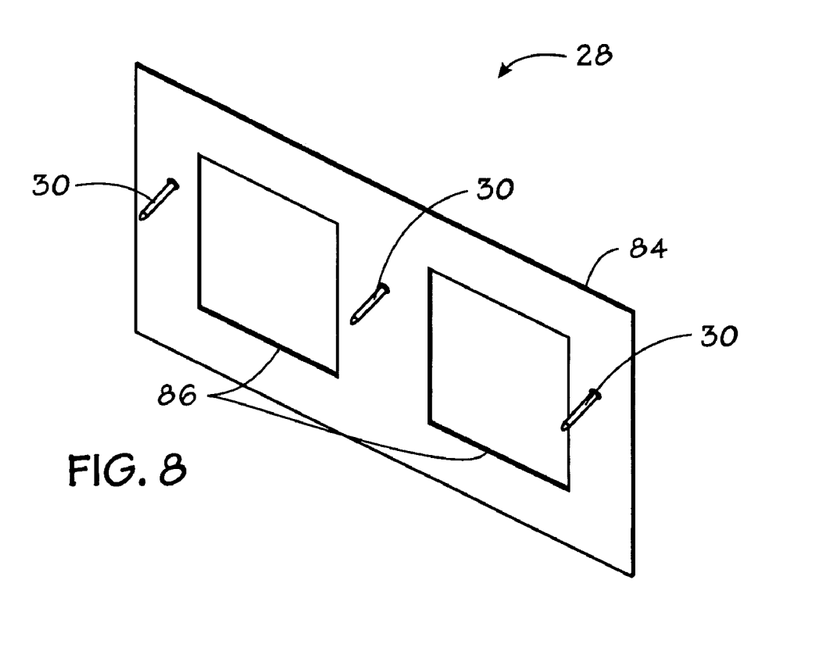
FIG. 8 is a perspective view of the base bracket of FIGS. 2 and 3 in accordance with one embodiment of the present technique.

The base bracket 28 may be provided with the common set of alignment pins 30 to aid in merging the power backplane 24 and the signal backplane 26, as discussed previously. For example, the base bracket 28 may include three alignment pins 30 coupled to a single base plate 84, as depicted in FIG. 8. As will be appreciated, the base bracket 28 may include any number and configuration of alignment pins 30 to provide for alignment of the backplane assembly 22.

Similar to the power backplane 24, the base plate 84 may also include cutouts 86 configured to allow access to components of the signal backplane 26. In one embodiment, the cutouts 86 may include enough clearance to allow additional connections to switch module connectors 68 located on the rear of the signal backplane 26 (see FIG. 7). The base bracket 28 may take a variety of shapes to accommodate specific applications. For example, the base bracket 28 may include cutouts 86 that provide for sufficient airflow to cool the backplane assembly 22 and servers 12 of the system 10.

In another embodiment, the alignment pins 30 may be separate from the base bracket 28. For example, the alignment pins 30 may be coupled to the power backplane 24 or the signal backplane 26. Thus, in one embodiment, the power backplane 24 and the signal backplane 26 may be aligned about the axis of the alignment pins 30 without the addition of a base bracket 28. Further, an embodiment may include several separate alignment pins 30 that are individually inserted into multiple alignment holes 64 and 82 to align the backplanes 24 and 26. Thus, the alignment pins 30 may be used individually to align the power backplane 24 and the signal backplane 26 about the axis of the pins 30.

Figure 9:
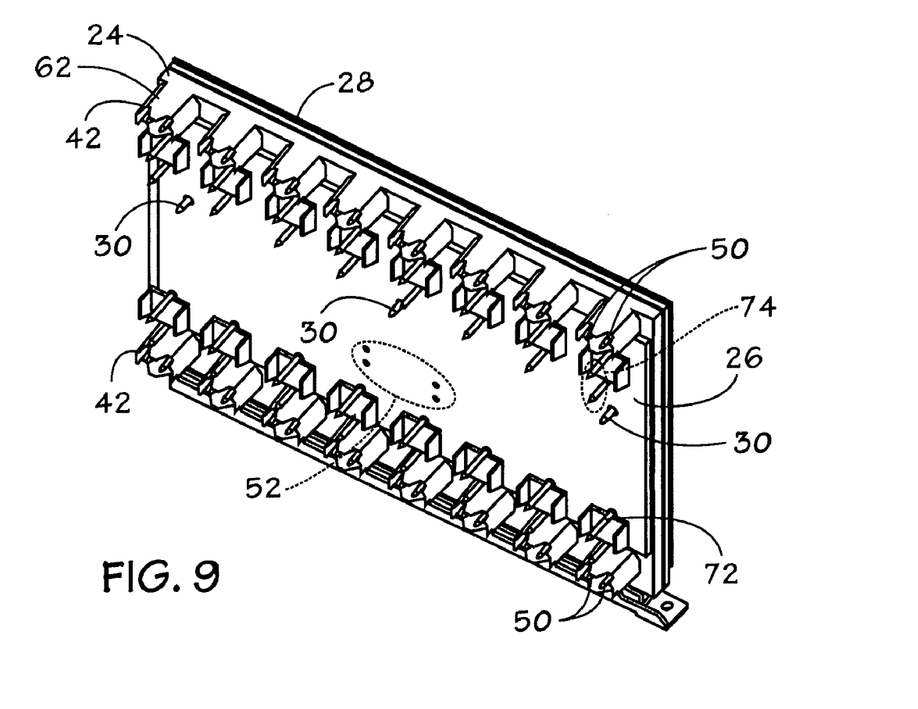
FIG. 9 is a perspective view of the assembled server backplane infrastructure of FIG. 2 in accordance with one embodiment of the present technique.

Turning now to FIG. 9, a perspective view an exemplary embodiment of a backplane assembly 22 is illustrated. As discussed above, the backplane assembly 22 includes the power backplane 24, the signal backplane 26 and the base bracket 28. In one embodiment, the backplane assembly 22 may be assembled to a chassis 14 and/or servers 12 in a system 10. As will be appreciated, servers 12 may include full height servers 88 as illustrated and described further below with reference to FIG. 10, configured for insertion into a single blade server bay. Full height servers may include dimensions such that a single server 12 is the height of the blade bay in which it is inserted. In another embodiment, the server 12 may include a single half height server 90 or two half height servers 90 configured to occupy a single blade server bay as illustrated and described further below with reference to FIG. 11. Half height server blades may include dimensions such that each server is half the height of the blade bay in which is inserted. Thus, two half height servers 12 may be staked one on top of the other, and inserted into a single blade bay.

Figure 10:
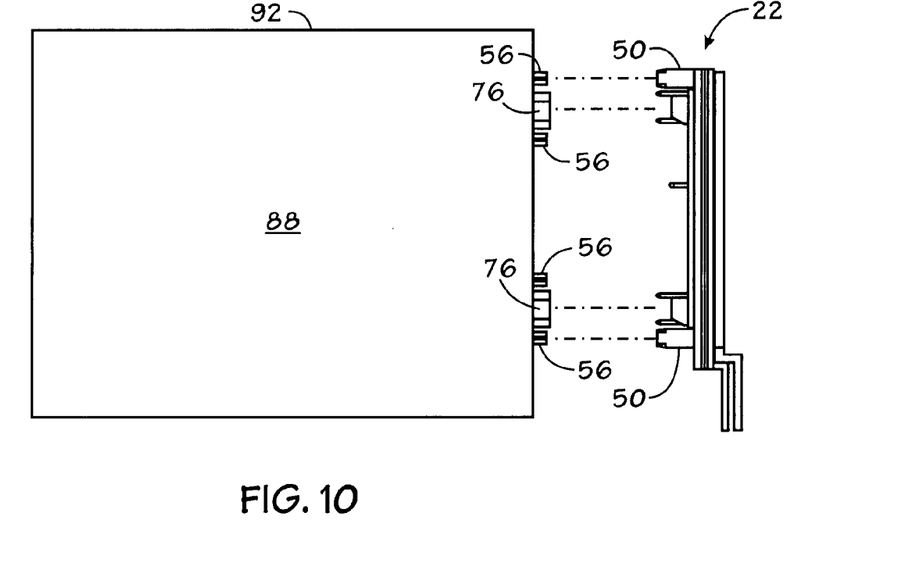
FIG. 10 is an exploded side view of a full height server aligned with the assembled server backplane infrastructure of FIG. 9 in accordance with one embodiment of the present technique.

An embodiment including a full height server 88 is depicted in FIG. 10. A full height server 88 may include a full height server enclosure 92, at least one server power connector 56 and at least one server signal connector 76. The server depicted in FIG. 10 includes four server power connectors 56 and two server signal connectors 76. Thus, for example, when inserted into the blade server bay of a chassis 14, the server power connectors 56 may mate with two pairs of server power delivery pins 50 of the backplane assembly 22. Further, the server signal connector 76 may be mated with the complementary signal connector 72 of the backplane assembly 22. As will be appreciated, the connectors 56 and 76 on the server 88 may include industry standard connectors that are generally aligned with an industry standard connector arrangement of the backplane assembly 22. In another embodiment, the connectors may be positioned to accommodate other specific applications.

Figure 11:
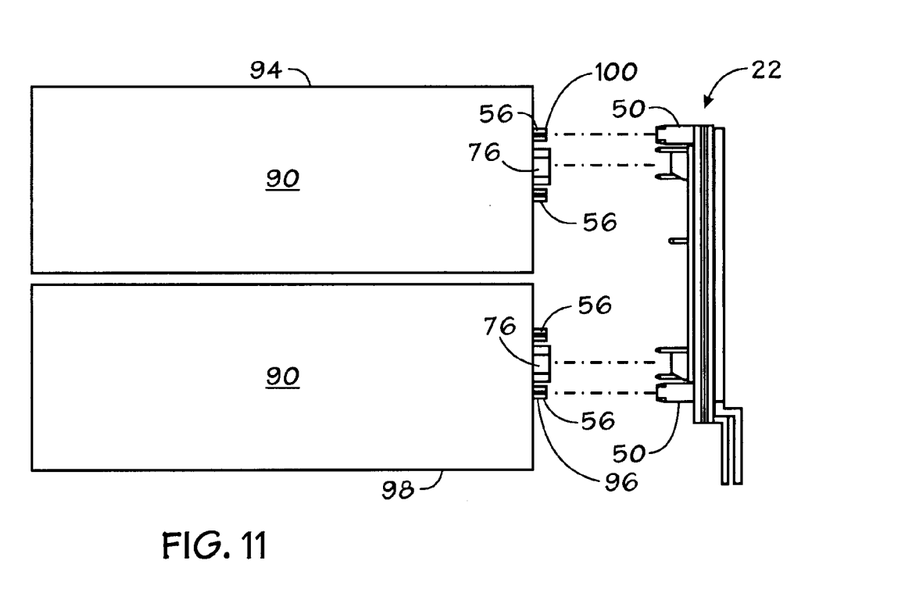
FIG. 11 is an exploded side view of two half height servers aligned with the assembled server backplane infrastructure of FIG. 9 in accordance with one embodiment of the present technique.

Half height servers 90 may be mated with the backplane assembly 22 in a manner similar to that discussed for the full height server 88. For example, two half height servers 90 may be configured in an orientation with one on top of the other, as depicted in FIG. 11. In this configuration, the server power connectors 56 of each half height server may mate with a pair of server power delivery pins 50 of the backplane assembly 22. Further, the server signal connector 76 of each half height module may mate with a complementary signal connector 72 of the backplane assembly 22.

In the depicted configuration of the half height servers 90, the configuration includes server power delivery pins 50 flanking the signal pins 74. Such a configuration may be advantageous as it enables each half height server 90 to be placed in the "top" or "bottom" position of a blade bay. For example, if the top half height server 94 is placed in the lower position and mated with the backplane assembly 22, a set of lower pins 96 of the power connector 56 on the server 90 may mate with the lower server power delivery pins 50. Similarly, if the bottom half height server 98 is placed in the upper position and mated with the backplane assembly 22, a set of upper pins 100 of the power connector 56 on the server 90 will mate with the upper server power delivery pins 50. Thus, a common connector configuration allows for both half height servers 90 to receive power from the power backplane 24. Note, the flanking position of the power delivery pins 50 may also eliminate or reduce the need to include cutouts in the signal backplane 26 that may otherwise be required to physically access a power connector 50 from the power backplane 24 if the connectors 50 were located near the center of the power backplane 24 and did not flank the signal backplane 26.

Figure 12:
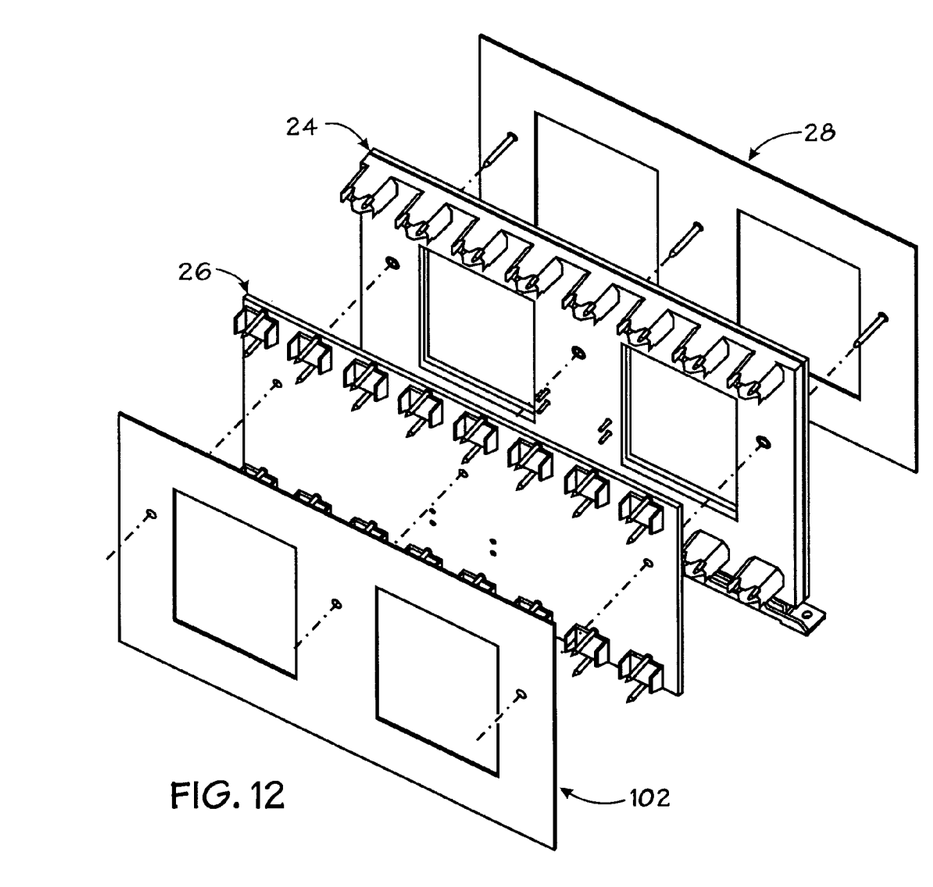
FIG. 12 is an exploded perspective view of an additional backplane coupled to the assembled server backplane infrastructure of FIG. 9 in accordance with one embodiment of the present technique.

In addition to the power backplane 24 and the signal backplane 26, the backplane assembly 22 may include additional backplanes configured for use in the system 10. For example, as depicted in FIG. 12, an additional backplane 102 may be coupled to or included in the backplane assembly 22. In one embodiment, an additional backplane may include alignment holes 104 and may be aligned to the backplane assembly 22 via the alignment pins 30 and alignment holes 104.

As will be appreciated, the backplane assembly 22 may include a multitude of additional backplanes 102 to accommodate various applications. For example, the backplane assembly 22 may include additional backplanes 102, such as a second signal backplane 26 to provide for routing more signals to the servers 12 and other components 20. Further, in one embodiment, the backplane assembly 22 may include additional backplanes 102 comprising multiple power backplanes configured to distribute an increasing amount of power. For example, one power backplane may be configured to deliver power at 12V and a second power backplane may be configured to deliver power at −48V. Additional backplanes 102 may also be provided and/or aligned to the backplane assembly 22 to provide mechanical (such as physical support or attachment to other components 20) as well as electrical functionality.

The modularity of the disclosed system 10 may provide for decreased development lead times. As will be appreciated, by providing independent components, as a system is redesigned many components may be interchanged without requiring a complete redesign. For example, if a server 12 requires an updated interface signal routing structure, the signal backplane 26 may be redesigned and coupled with an existing/pre-designed power backplane 24. Thus, efforts in design and implementation may be reduced to meet the demands signal routing and power distribution in server systems 10.

What is claimed is:

1. A server backplane infrastructure comprising:
   a passive power backplane configured to distribute power and comprising a first set of alignment holes, wherein the passive power backplane is without active components, wherein the passive power backplane is provided with a conductive structure to distribute power but the passive power backplane does not route signals, and wherein the passive power backplane has power delivery pins;
   a signal backplane separate from the passive power backplane and configured to route interface signals and comprising a second set of alignment holes, wherein the signal backplane has signal connectors and power input elements receiving and electrically connected to a subset of the power delivery pins to provide power to the signal backplane;
   a set of common alignment pins, each alignment pin having an axis, wherein the set of common alignment pins are inserted into the first set of alignment holes and the second set of alignment holes to align the passive power backplane and the signal backplane about the axis; and a base bracket, wherein the set of common alignment pins extends from the base bracket,
   wherein an assembly of the aligned passive power backplane and the signal backplane provides an arrangement of the signal connectors and the power delivery pins, the arrangement having a first group of the signal connectors and the power delivery pins along a first side of the signal backplane, and a second group of the signal connectors and the power delivery pins along a second side of the signal backplane, and wherein the signal connectors and the power delivery pins of the arrangement are configured for connection to corresponding connectors of electronic devices.

2. The server backplane infrastructure of claim 1, wherein the passive power backplane comprises a positive power plane and a negative power plane.

3. The server backplane infrastructure of claim 2, wherein the passive power backplane comprises a printed circuit board comprising the positive power plane, the negative power plane and an insulating layer between the positive power plane and the negative power plane.

4. The server backplane infrastructure of claim 2, wherein the positive power plane and the negative power plane each comprise a plate of conductive material.

5. The server backplane infrastructure of claim 4, wherein the conductive material comprises copper.

6. The server backplane infrastructure of claim 1, wherein the passive power backplane comprises passive components.

7. The server backplane infrastructure of claim 1, wherein the passive power backplane comprises a power connector configured to electrically couple the passive power backplane to a power connector of a server.

8. The server backplane infrastructure of claim 1, wherein the passive power backplane is configured to receive power from a power source.

9. The server backplane infrastructure of claim 3, wherein the signal backplane comprises a printed circuit board.

10. The server backplane infrastructure of claim 1, comprising an additional backplane coupled to the server backplane infrastructure.

11. A server backplane comprising:
   a passive power backplane configured to distribute power and comprising a first set of alignment holes, wherein the passive power backplane is without active components, wherein the passive power backplane is provided with a conductive structure to distribute power but the passive power backplane does not route signals, and wherein the passive power backplane has first power delivery pins for providing power to servers, and second power delivery pins;
   a signal backplane separate from the passive power backplane and configured to route interface signals and comprising a second set of alignment holes, wherein the signal backplane has signal connectors and power input elements receiving and electrically connected to the second power delivery pins to provide power to the signal backplane; and a base bracket having a set of alignment pins configured to be inserted into the first and second sets of alignment holes to align the passive power backplane and the signal backplane, wherein an assembly of the aligned passive power backplane and the signal backplane provides an arrangement of the signal connectors and the first power delivery pins, the arrangement having a first group of the signal connectors and the first power delivery pins along a first side of the signal backplane, and a second group of the signal connectors and the first power delivery pins along a second side of the signal backplane, and where the signal connectors and the first power delivery pins of the arrangement are configured for connection to corresponding connectors of the respective servers.

12. The server backplane of claim 11, wherein alignment of the power backplane and the signal backplane is configured to align the power backplane and the signal backplane for mating to a complementary device.

13. The server backplane of claim 11, wherein the passive power backplane is configured to distribute power to the server independent of the signal backplane.

14. The server backplane of claim 11, wherein the passive power backplane comprises a printed circuit board comprising a positive power plane, a negative power plane and an insulating layer.

15. The server backplane of claim 14, wherein the positive power plane and the negative power plane each comprise a plate of conductive material.

16. The server backplane of claim 11, wherein the signal backplane is configured to route interface signals to the server.

17. A server infrastructure comprising:
a server rack configured to house server blades;
wherein each of the server blades comprises a blade power connector and a blade signal connector; and
a server backplane comprising:
  a passive power backplane configured to distribute power and comprising a first set of alignment holes, wherein the passive power backplane is without active components, wherein the passive power backplane is provided with a conductive structure to distribute power but the passive power backplane does not route signals, and wherein the passive power backplane has power delivery pins;
  a signal backplane separate from the passive power backplane and configured to route interface signals and comprising a second set of alignment holes, and signal connectors and power input elements receiving and electrically connected to a subset of the power delivery pins to provide power to the signal backplane; and
  a set of common alignment pins, wherein each alignment pin has an axis, wherein the set of common alignment pins are inserted into the first set of alignment holes and the second set of alignment holes to align the passive power backplane and the signal backplane about the axis, wherein the set of common alignment pins comprise at least two alignment pins extending from a base bracket,
wherein the aligned passive power backplane and the signal backplane provide an arrangement of the signal connectors and the power delivery pins, the arrangement having a first group of the signal connectors and the power delivery pins along a first side of the signal backplane, and a second group of the signal connectors and the power delivery pins along a second side of the signal backplane, and wherein the signal connectors and the power delivery pins of the arrangement are connected to corresponding blade signal connectors and blade power connectors of the server blades.

18. The server infrastructure of claim 17, wherein each of the server blades comprises a full height server blade.

19. The server infrastructure of claim 17, wherein each of the server blades comprises a half-height server blade.

20. The server infrastructure of claim 17, wherein the passive power backplane is configured to distribute power to multiple components housed in the server rack.

21. The server infrastructure of claim 17, wherein the passive power backplane comprises a printed circuit board comprising a positive power plane, a negative power plane and an insulating layer.

22. The server infrastructure of claim 21, wherein the signal backplane comprises a printed circuit board.

23. The server infrastructure of claim 17, wherein the passive power backplane is configured to distribute power to the server blades independent of the signal backplane.

24. The server backplane of claim 11, wherein the passive power backplane further comprises a third power delivery pin to provide power to a fan.

25. The server infrastructure of claim 17, wherein the subset of power delivery pins is a first subset of power delivery pins, and wherein the power delivery pins in the first and second groups are part of a second subset of power delivery pins.

26. The server backplane of claim 25, further comprising a cooling fan, and wherein the passive power backplane further comprises another power delivery pin to provide power to the cooling fan.

* * * * *

UNITED STATES PATENT AND TRADEMARK OFFICE
CERTIFICATE OF CORRECTION

| | | |
|---|---|---|
| PATENT NO. | : 8,009,438 B2 | Page 1 of 1 |
| APPLICATION NO. | : 11/729470 | |
| DATED | : August 30, 2011 | |
| INVENTOR(S) | : Kevin B. Leigh et al. | |

It is certified that error appears in the above-identified patent and that said Letters Patent is hereby corrected as shown below:

In column 10, line 12, in Claim 1, delete "extends" and insert -- extend --, therfor.

Signed and Sealed this
Twentieth Day of March, 2012

David J. Kappos
*Director of the United States Patent and Trademark Office*